US006849904B2

(12) United States Patent
Tien et al.

(10) Patent No.: US 6,849,904 B2
(45) Date of Patent: Feb. 1, 2005

(54) EFFICIENT SOURCE DIFFUSION INTERCONNECT, MOS TRANSISTOR AND STANDARD CELL LAYOUT UTILIZING SAME

(75) Inventors: Li-Chun Tien, Tainan (TW); Ching-Hao Shaw, Hsin-Chu (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 0 days.

(21) Appl. No.: 10/424,319

(22) Filed: Apr. 28, 2003

(65) Prior Publication Data

US 2004/0211983 A1 Oct. 28, 2004

(51) Int. Cl.[7] .......................... H01L 29/76; H01L 29/94; H01L 31/062; H01L 31/113; H01L 31/119

(52) U.S. Cl. ........................ 257/371; 257/369; 257/382
(58) Field of Search ................................. 257/371, 369, 257/382, 206, 377

(56) References Cited

U.S. PATENT DOCUMENTS 5,654,572 A * 8/1997 Kawase ...................... 257/371
5,880,503 A * 3/1999 Matsumoto et al. ........ 257/372

* cited by examiner

Primary Examiner—Phat X. Cao
(74) Attorney, Agent, or Firm—Tung & Associates

(57) ABSTRACT

Standard cell layout efficiency is improved by utilization of a MOS interconnect that minimizes features and geometries requiring compliance with space intensive design rules. Source diffusion regions of MOS structures have a substantially constant width extension extending toward a substrate pick-up diffusion and shares a common silicidation therewith to effect an ohmic contact thereto.

16 Claims, 2 Drawing Sheets

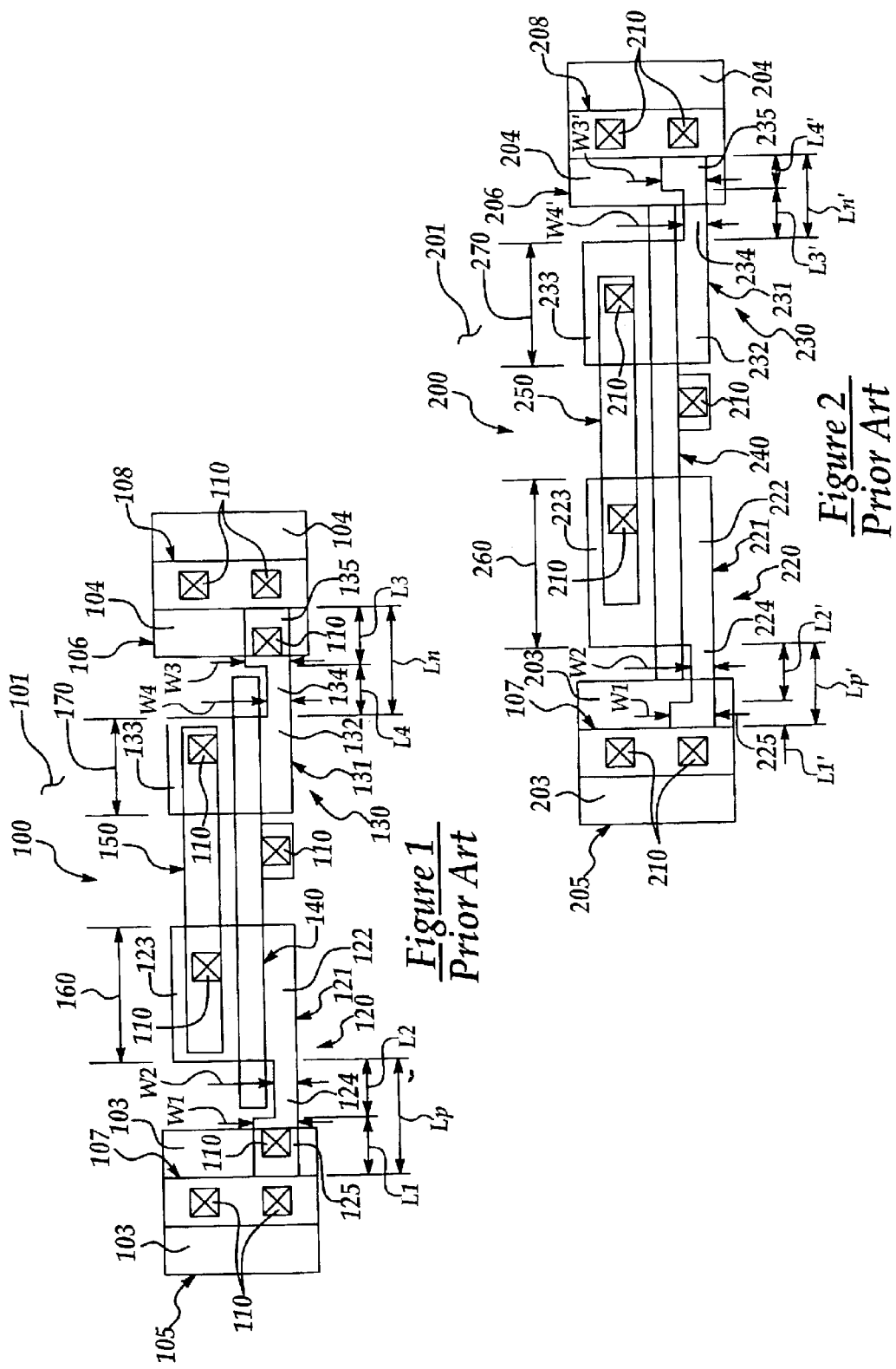

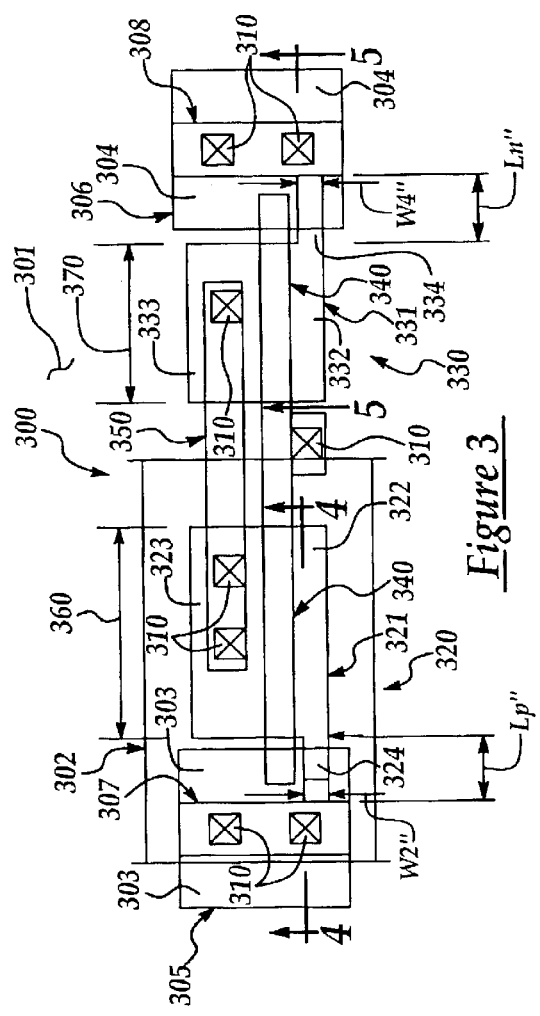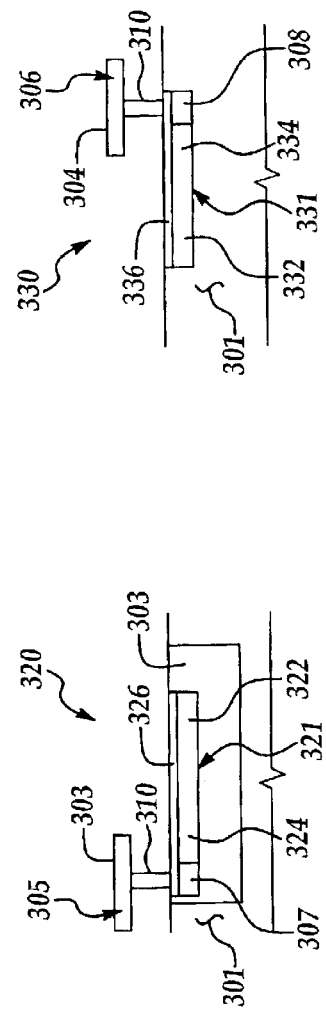

US 6,849,904 B2

EFFICIENT SOURCE DIFFUSION INTERCONNECT, MOS TRANSISTOR AND STANDARD CELL LAYOUT UTILIZING SAME

TECHNICAL FIELD

The present invention is generally related to integrated circuits. More particularly, the invention relates to efficient utilization of layout area.

BACKGROUND OF THE INVENTION

1. General

The semiconductor industry continually moves toward fabricating larger and more complex functions on a given semiconductor chip. The larger and more complex functions are achieved by reducing device sizes and spacing and by reducing the junction depth of regions formed in the semiconductor substrate. However, strict adherence to design rules is required of layout designs and poses significant necessary obstacles to reducing layout area utilization. Since many integrated circuits include very large numbers of standard cells, any reduction of cell dimensions can yield large benefits in terms of overall circuit density.

2. Description of the Related Art

With reference first to FIG. 1, a first standard cell complementary metal oxide semiconductor (CMOS) device 100 is shown in layout view. Such devices are employed in a variety of integrated circuit applications including non-limiting examples of buffers, inverters and memory units. CMOS device 100 is illustrated as being fabricated in a silicon bulk substrate 101 of p-type conductivity. CMOS device 100 includes P-MOS transistor 120 and N-MOS transistor 130. Power and ground are provided by voltage rails 105 and 106, respectively. P-MOS transistor 120 includes a p-type diffusion structure 121 and N-MOS transistor 130 includes and n-type diffusion structure 131. Though not separately illustrated, the P-MOS transistor 120 further includes a well of n-type conductivity substrate (N-well) wherein the p-type diffusion structure 121 is disposed. Each transistor further includes a gate structure 140, typically polysilicon or a silicided polysilicon, coupled to gate/metal contact 110 for coupling the gate structure 140 to a metal structure (not separately illustrated). Gate structure 140 is electrically common between the two transistors and effects complementary switching of the respective transistors in accordance with the voltage signal applied thereto via contact 110. P-type diffusion structure 121 includes drain diffusion region 123 on one side of the gate structure 140. Similarly, n-type diffusion structure 131 includes drain diffusion region 133 on the same side of the gate structure 140 as drain diffusion region 123 is to p-type diffusion structure 121. Each drain diffusion region 123 and 133 is commonly coupled via respective diffusion/metal contacts 110 to output metal 150. On the opposite side of the gate structure 140 (i.e. across the transistor channels) are source diffusion regions 122 and 132 corresponding to respective channel widths of each of p-type diffusion structure 121 and n-type diffusion structure 131, respectively. Each of P-MOS transistor 120 and N-MOS transistor 130 has a channel width labeled 160 and 170, respectively. Source diffusion structure 121 also includes dogbone diffusion region 125 and interconnect diffusion region 124 running between dogbone diffusion region 125 and source diffusion region 122. Diffusion/metal contact 110 couples source diffusion region 122 to metal 103 via dogbone diffusion region 125 and connecting diffusion region 124. Metal 103 comprises a portion of voltage rail 105. Well pick-up diffusion 107 is a diffusion region of n-type conductivity also disposed within the N-well substrate (not separately illustrated) and is coupled to voltage rail 105 via diffusion/metal contacts 110 which couple well pick-up diffusion 107 to metal 103. Dogbone diffusion region 125 is illustrated butting well pick-up diffusion 107 and having a width W1 and a length L1. Interconnect diffusion region 124 has a length L2 and a width W2. Dogbone diffusion region 125 and interconnect diffusion region 124 have a combined length Lp which is also the separation between well pick-up diffusion 107 and source diffusion region 122.

Similarly, source diffusion structure 131 also includes dogbone diffusion region 135 and interconnect diffusion region 134 running between dogbone diffusion region 135 and source diffusion region 132. Diffusion/metal contact 110 couples source diffusion region 132 to metal 104 via dogbone diffusion region 135 and connecting diffusion region 134. Metal 104 comprises a portion of voltage rail 106. Bulk substrate pick-up diffusion 108 is a diffusion region of p-type conductivity and is coupled to voltage rail 106 via diffusion/metal contacts 110 which couple bulk substrate pick-up diffusion 108 to metal 104. Dogbone diffusion region 135 is illustrated butting bulk substrate pick-up diffusion 108 and having a width W3 and a length L3. Interconnect diffusion region 134 has a length L4 and a width W4. Dogbone diffusion region 135 and interconnect diffusion region 134 have a combined length Ln which is also the separation between bulk substrate pick-up diffusion 108 and source diffusion region 132.

As can be appreciated by examination of the layout exhibited in FIG. 1, significant area is dedicated to the coupling of the source diffusion regions to the voltage rails. Some of the design considerations which dictate the overall spacing Lp include minimum contact to diffusion spacing, minimum contact overlap of diffusion, minimum contact spacing, minimum active overlap of polysilicon, minimum contact size, minimum source diffusion to dogbone diffusion spacing.

Turning now to FIG. 2, a second standard cell CMOS device 200 is shown in layout view and is fabricated in a silicon bulk substrate 201 of p-type conductivity. CMOS device 200 includes P-MOS transistor 220 and N-MOS transistor 230. Power and ground are provided by voltage rails 205 and 206, respectively. P-MOS transistor 220 includes a p-type diffusion structure 221 and N-MOS transistor 230 includes and n-type diffusion structure 231. Though not separately illustrated, the P-MOS transistor 220 further includes a well of n-type conductivity substrate (N-well) wherein the p-type diffusion structure 221 is disposed. Each transistor further includes a gate structure 240 coupled to gate/metal contact 210 for coupling the gate structure 240 to a metal structure (not separately illustrated). Gate structure 240 is electrically common between the two transistors and effects complementary switching of the respective transistors in accordance with the voltage signal applied thereto via contact 210. P-type diffusion structure 221 includes drain diffusion region 223 on one side of the gate structure 240. Similarly, n-type diffusion structure 231 includes drain diffusion region 233 on the same side of the gate structure 240 as drain diffusion region 223 is to p-type diffusion structure 221. Each drain diffusion region 223 and 233 is commonly coupled via respective diffusion/metal contacts 210 to output metal 250. On the opposite side of the gate structure 240 (i.e. across the transistor channels) are source diffusion regions 222 and 232 corresponding to respective channel widths of each of p-type diffusion structure 221 and n-type diffusion structure 231, respectively. Each of P-MOS transistor 220 and N-MOS transistor 230 has a channel width labeled 260 and 270, respectively. Source diffusion structure 221 also includes dogbone diffusion region 225 and interconnect diffusion region 224 running between dogbone diffusion region 225 and source diffusion region 222. Metal 203 comprises a portion of voltage rail 205. Well pick-up diffusion 207 is a diffusion region of n-type conductivity also disposed within the N-well substrate (not separately illustrated) and is coupled to voltage rail 205. Dogbone diffusion region 225 is butting well pick-up diffusion 207 and having a width W1' and a length L1'. Interconnect diffusion region 224 has a length L2' and a width W2'. Dogbone diffusion region 225 and interconnect diffusion region 224 have a combined length Lp' which is also the separation between well pick-up diffusion 207 and source diffusion region 222. Silicided source diffusion region 222, including silicided interconnect diffusion region and silicided dogbone diffusion region 225, and a silicided well pick-up diffusion 207 provides ohmic coupling between the source and well pick-up. In turn, contacts 210, which are preferably silicide/metal contacts but which may take the form of diffusion/metal contacts, ohmically couple the pick-up diffusion 207 to metal 203, thereby providing ohmic coupling of the source region 222 to voltage rail 205.

Similarly, source diffusion structure 231 also includes dogbone diffusion region 235 and interconnect diffusion region 234 running between dogbone diffusion region 235 and source diffusion region 232. Metal 204 comprises a portion of voltage rail 206. Bulk substrate pick-up diffusion 208 is a diffusion region of p-type conductivity and is coupled to voltage rail 206. Dogbone diffusion region 235 is illustrated butting bulk substrate pick-up diffusion 208 and having a width W3' and a length L3'. Interconnect diffusion region 234 has a length L4' and a width W4'. Dogbone diffusion region 235 and interconnect diffusion region 234 have a combined length Ln' which is also the separation between bulk substrate pick-up diffusion 208 and source diffusion region 232. Silicided source diffusion region 232, including silicided interconnect diffusion region and silicided dogbone diffusion region 235, and a silicided well pick-up diffusion 208 provides ohmic coupling between the source and well pick-up. In turn, contacts 210, which are preferably silicide/metal contacts but which may take the form of diffusion/metal contacts, ohmically couple the pick-up diffusion 208 to metal 204, thereby providing ohmic coupling of the source region 232 to voltage rail 206.

As can be appreciated by examination of the layout exhibited in FIG. 2, though some improvements over the layout exhibited in FIG. 1 are apparent, significant area is still dedicated to the coupling of the source diffusion regions to the voltage rails. Some of the design considerations which dictate the overall spacing Lp' include minimum contact to diffusion spacing, minimum contact overlap of diffusion, minimum active overlap of polysilicon, minimum source diffusion to dogbone diffusion spacing.

SUMMARY OF THE INVENTION

It is recognized that continually improving layout area utilization is necessary to remain competitive in the semiconductor industry. This is true regardless of the complementary trend toward smaller absolute dimensioning of semiconductor fabrications.

It is further recognized that layout improvements which provide greater performance and density must not come at the expense of reliability or chip yield. Therefore, strict adherence to design rules and criteria is required at all times in the quest for improvements to layouts.

It is further recognized that even seemingly small improvements to one portion of a layout may yield significant absolute and overall improvements where such improvements are part of a standard cell layout that is utilized repetitively in significant numbers.

In accordance with the present invention, in a MOS transistor a source to voltage rail interconnect includes a substrate pick-up of a first conductivity type coupled to a voltage rail. A source diffusion extension of a second conductivity type extending away from the source diffusion toward the substrate pick-up is characterized by a substantially unvarying width. An uninterrupted silicide layer overlies at least a portion of the substrate pick-up and the source diffusion extension and is effective to provide an ohmic connection therebetween. Such an interconnect eliminates features and geometries which otherwise require design rule compliance resulting in increase layout area.

Similarly, a MOS device includes a semiconductor substrate of a first conductivity type and a diffusion structure of a second conductivity type including source and drain regions disposed within the substrate. A substrate pick-up region of the first conductivity type is disposed within the substrate. The diffusion structure further includes an interconnect region wherein the interconnect region is characterized by a substantially uniform width. At least a portion of the substrate pick-up region and the interconnect region are silicided to effect ohmic coupling therebetween. Such a MOS device eliminates features and geometries which otherwise require design rule compliance resulting in increased layout area utilization.

A standard cell for a CMOS device includes a pair of CMOS transistors having respective source diffusion regions located between a pair of voltage rails. Pick-up diffusion regions couple to the voltage rails. Each of said respective source diffusion regions is coupled to a respective pick-up diffusion region via a substantially constant width silicided connecting portion of the source diffusion regions. Such a standard cell eliminates features and geometries which otherwise require design rule compliance resulting in increased layout area utilization.

BRIEF DESCRIPTION OF THE DRAWINGS

The present invention will now be described, by way of example, with reference to the accompanying drawings, in which:

FIG. 1 is a layout view of a first related art standard cell for a CMOS device;

FIG. 2 is a is a layout view of a second related art standard cell for a CMOS device;

FIG. 3 is a layout view of an exemplary standard cell for a CMOS device in accordance with the present invention;

FIG. 4 is a partial sectional view of taken along line 4—4 of the layout view of the exemplary standard cell for a CMOS device illustrated in FIG. 3; and, FIG. 5 is a partial sectional view of taken along line 5—5 of the layout view of the exemplary standard cell for a CMOS device illustrated in FIG. 3;

DESCRIPTION OF THE PREFERRED EMBODIMENT

Turning now to FIG. 3 and sectional FIGS. 4 and 5 taken along respectively labeled portions of FIG. 3, a preferred embodiment of the present invention is illustrated in layout and partial sectional views. A novel standard cell CMOS device 300 is illustrated as being fabricated in a silicon bulk substrate 301 of p-type conductivity. CMOS device 300 includes P-MOS transistor 320 and N-MOS transistor 330. Power and ground are provided by voltage rails 305 and 306, respectively. P-MOS transistor 320 includes a p-type diffusion structure 321 and N-MOS transistor 330 includes and n-type diffusion structure 331. P-MOS transistor 320 further includes a well of n-type conductivity substrate, N-well 302, wherein the p-type diffusion structure 321 is disposed. Each transistor further includes a gate structure 340 coupled to gate/metal contact 310 for coupling the gate structure 340 to a metal structure (not separately illustrated). Gate structure 340 is electrically common between the two transistors and effects complementary switching of the respective transistors in accordance with the voltage signal applied thereto via contact 310. P-type diffusion structure 321 includes drain diffusion region 323 on one side of the gate structure 340. Similarly, n-type diffusion structure 231 includes drain diffusion region 333 on the same side of the gate structure 340 as drain diffusion region 323 is to p-type diffusion structure 321. Each drain diffusion region 323 and 333 is commonly coupled via respective diffusion/metal contacts 310 to output metal 350. On the opposite side of the gate structure 340 (i.e. across the transistor channels) are source diffusion regions 322 and 332 corresponding to respective channel widths of each of p-type diffusion structure 321 and n-type diffusion structure 331, respectively. Each of P-MOS transistor 320 and N-MOS transistor 330 has a channel width labeled 360 and 370, respectively. Source diffusion structure 321 also includes interconnect diffusion region 324 running directly between source diffusion region 322 and well pick-up diffusion 307. Interconnect diffusion region 324 is butting well pick-up diffusion 307 and has width W2" and length Lp". Alternatively, interconnect diffusion region 324 may be adjacent to but spaced apart from well pick-up diffusion 307. Interconnect diffusion region 324 length Lp" is also the separation between well pick-up diffusion 307 and source diffusion region 322. Metal 303 comprises a portion of voltage rail 305. Well pick-up diffusion 307 is a diffusion region of n-type conductivity also disposed within N-well 302 substrate and is coupled to voltage rail 305.

Similarly, source diffusion structure 331 also includes interconnect diffusion region 334 running directly between source diffusion region 332 and bulk substrate pick-up diffusion 308. Interconnect diffusion region 334 is illustrated butting bulk substrate pick-up diffusion 308 and having a width W4' and a length Ln". Alternatively, interconnect diffusion region 334 may be adjacent to but spaced apart from well pick-up diffusion 308. Interconnect diffusion region 334 length Ln" is also the separation between bulk substrate pick-up diffusion 308 and source diffusion region 332. Metal 304 comprises a portion of voltage rail 306. Bulk substrate pick-up diffusion 308 is a diffusion region of p-type conductivity and is coupled to voltage rail 306.

As most clearly seen with reference to the partial sectional views of FIGS. 4 and 5, silicidation in accordance with the present invention provides for ohmic coupling of the transistors to the respective voltage rails without the consumption of layout space required by interlayer contacts or dogbone structures. P-MOS diffusions 321 and 307 are silicided 326. Silicide layer 326 ohmically couples the well pick-up diffusion 307 to the source diffusion region 322. A continuous and unbroken silicide layer covers at least a portion of the well pick-up diffusion 307 and the interconnect diffusion region 324 and, in the case of pick-up diffusion and interconnect diffusion regions that are spaced, also bridges the silicon substrate therebetween to effect the ohmic coupling. Similarly for the N-MOS transistor 330 of FIG. 5, diffusions 331 and 308 are silicided 336. Silicide layer 336 ohmically couples the bulk substrate pick-up diffusion 308 to the source diffusion region 332. A continuous and unbroken silicide layer covers at least a portion of the bulk substrate pick-up diffusion 308 and the interconnect diffusion region 334 and, in the case of pick-up diffusion and interconnect diffusion regions that are spaced, also bridges the silicon substrate therebetween to effect the ohmic coupling.

In both transistors of FIGS. 3 through 5 silicide/metal contacts 310 are variously shown for ohmically coupling the pick-up diffusions 307,308 to respective metal 303,304. Alternatively, contacts 310 may be diffusion/metal contacts for effecting the ohmic coupling. Additionally, a CMOS standard cell comprising a single N-well, P-MOS and N-MOS in p-type bulk substrate has been described. However, one skilled in the art will realize that the present invention may be practiced in accordance with single P-well, N-MOS and P-MOS in n-type bulk substrate. One skilled in the art will also recognized that the present invention is equally practically implemented in a dual well CMOS structure such as may be practiced with silicon-on-insulator processes and technologies and the like.

It can be qualitatively appreciated from the foregoing that the contact structures and improved layout exhibited in accordance with the present invention as described with respect to FIGS. 3 through 5 allow for compression of standard cell layout between voltage rails while simultaneously preserving transistor performance by allowing channel widths to remain unchanged. Alternatively, it can be qualitatively appreciated from the foregoing that the contact structures and improved layout in accordance with the present invention allow for improved transistor performance by allowing channel width expansion into layout areas formerly reserved due to interconnect requirements and design rule restrictions without increasing the overall standard cell layout between voltage rails.

Fabrication of a structure as described and illustrated in reference to FIGS. 3 through 5 is accomplished in accordance with conventional CMOS processes and technologies known to those skilled in the art. Furthermore, the present invention is not dependent upon specific fabrication technologies. As such, detailed explanation of fabrication steps are not required herein and only general steps applicable to a p-type bulk substrate/N-well process are the subject of exposition. Beginning with a p-type bulk substrate conventional oxide layer is grown and the N-well is patterned and implanted followed by removal of the oxide layer. Nitride is deposited and patterned to the transistor areas. Next, field oxide layer is grown around the pattern defined by nitride and the nitride removed. Gate oxide is grown in the transistor patterned area and gate polysilicon is grown and patterned. Diffusion structures (sources, drains, interconnects, pick-ups) are doped using p-select and n-select masks. Silicidation of the gate polysilicon and diffusion structures (sources, drains, interconnects, pick-ups) is next accomplished such as for example using a sputter/sinter, chemical vapor deposition and self-aligned silicidation (salicide) processing. Titanium and Cobalt are commonly used silicide metals as are tantalum and tungsten. Silicidation includes silicidation of any gaps between non-butted diffusion structures that are desirably ohmically coupled (i.e. interconnect diffusion regions and pick-up diffusion regions). An oxide layer next covers the structure and is patterned for silicide/metal and/or diffusion/metal contacts. Metal is next deposited and patterned. Of course, additional and more detailed processing steps may be interspersed or added to the general steps outlined, including additional via and metal layer processing and backend processing steps not described herein.

The invention has been described with respect to certain preferred embodiments to be taken by way of example and not by way of limitation. Certain alternative implementations and modifications may be apparent to one exercising ordinary skill in the art. Therefore, the scope of invention as disclosed herein is to be limited only with respect to the appended claims.

The invention in which an exclusive property or privilege is claimed are defined as follows.

What is claimed is:

1. A MOS device comprising:

a semiconductor substrate of a first conductivity type;

a diffusion structure of a second conductivity type including source and drain regions disposed within the substrate;

a substrate pick-up region of the first conductivity type disposed within the substrate, wherein said substrate pick-up region receives power without said power passing through another substrate pick-up region different than said substrate pick-up region;

said diffusion structure further including an interconnect region wherein the interconnect region is characterized by a substantially uniform width; and, wherein at least a portion of the substrate pick-up region and the interconnect region are silicided to effect ohmic coupling therebetween.

2. The MOS device as claimed in claim 1 wherein the semiconductor substrate and substrate pick-up region comprise N-type silicon and the diffusion structure comprises P-type silicon.

3. The MOS device as claimed in claim 1 wherein the semiconductor substrate and substrate pick-up region comprise P-type silicon and the diffusion structure comprises N-type silicon.

4. The MOS device as claimed in claim 2 wherein the semiconductor substrate is a bulk substrate.

5. The MOS device as claimed in claim 2 wherein the semiconductor substrate is an N-well.

6. The MOS device as claimed in claim 5 wherein the N-well is disposed in a P-type bulk substrate.

7. The MOS device as claimed in claim 3 wherein the semiconductor substrate is a P-well.

8. The MOS device as claimed in claim 7 wherein the P-well is disposed in an N-type bulk substrate.

9. A standard cell for a CMOS device comprising:

a pair of CMOS transistors having respective source diffusion regions located between a pair of voltage rails;

pick-up diffusion regions coupled to the voltage rails; and wherein each of said respective source diffusion regions is coupled to a respective pick-up diffusion region via a substantially constant width silicided connecting portion of the source diffusion regions, and wherein said voltage rails provide power to each of said substrate pick-up regions without said power passing through another substrate pick-up region different than each of said substrate pick-up regions.

10. A standard cell for a CMOS device as claimed in claim 9 wherein the CMOS device further comprises a single well device.

11. A standard cell for a CMOS device as claimed in claim 9 wherein the CMOS device further comprises a dual well device.

12. A standard cell for a CMOS device as claimed in claim 9 wherein the pick-up diffusion regions is coupled to the voltage rails through the silicided connecting portion.

13. In a MOS transistor, a source to voltage rail interconnect comprising:

a substrate pick-up of a first conductivity type coupled to a voltage rail, wherein said voltage rail provides power to said substrate pick-up without said power passing through another substrate pick-up different than said substrate pick-up;

a source diffusion extension of a second conductivity type extending away from the source diffusion toward the substrate pick-up and characterized by a substantially unvarying width; and, an uninterrupted silicide layer overlying at least a portion of the substrate pick-up and the source diffusion extension effective to provide an ohmic connection therebetween.

14. The interconnect as claimed in claim 13 wherein the substrate pick-up and the source diffusion extension are butted.

15. The interconnect as claimed in claim 13 wherein the substrate pick-up and the source diffusion extension are in spaced adjacency and the uninterrupted silicide layer bridges therebetween.

16. The interconnect as claimed in claim 13 wherein substrate pick-up of a first conductivity type is coupled to the voltage rail through the silicide layer.

* * * * *